United States Patent
Harris et al.

(10) Patent No.: US 12,429,518 B2
(45) Date of Patent: Sep. 30, 2025

(54) INTERFACE BUILT IN TEST FAILURE DETECTION APPARATUS

(71) Applicant: Raytheon Company, Waltham, MA (US)

(72) Inventors: Micky Harris, Lompoc, CA (US); Magathi J. Willis, Broomfield, CO (US)

(73) Assignee: RAYTHEON COMPANY, Tewksbury, MA (US)

( * ) Notice: Subject to any disclaimer, the term of this patent is extended or adjusted under 35 U.S.C. 154(b) by 263 days.

(21) Appl. No.: 18/354,808

(22) Filed: Jul. 19, 2023

(65) Prior Publication Data
US 2025/0027989 A1     Jan. 23, 2025

(51) Int. Cl.
*G01R 31/28*     (2006.01)
(52) U.S. Cl.
CPC .................. *G01R 31/2884* (2013.01)
(58) Field of Classification Search
CPC .................. G01R 31/2884; H03L 7/085
USPC .................. 324/762.01, 537, 500
See application file for complete search history.

(56) References Cited

U.S. PATENT DOCUMENTS

| | | | |
|---|---|---|---|
| 4,031,463 A | 6/1977 | Norberg | |
| 8,233,974 B2 * | 7/2012 | Ward | A61B 5/0537 600/547 |
| 8,253,453 B2 | 8/2012 | Vilas Boas et al. | |
| 12,032,015 B1 * | 7/2024 | Strulovici | G01R 31/2831 |
| 2024/0329123 A1 * | 10/2024 | Miyazaki | H03L 7/085 |

* cited by examiner

*Primary Examiner* — Giovanni Astacio-Oquendo
(74) *Attorney, Agent, or Firm* — CANTOR COLBURN LLP

(57) ABSTRACT

An interface BIT failure detection circuit includes a sequencing circuit and a multiplexer. The sequencing circuit configured to generate the sequence selection signal. The multiplexer is in signal communication with the sequencing circuit, and includes a plurality of interface input. Each interface input corresponds to an interface of a device under test. The sequence selection signal is configured to control the MUX to sequentially select each of the interface inputs. The MUX includes an output terminal configured to output a test signal configured to indicate whether or not at least one fault corresponding to one or more of the interface inputs or a main power supply exists.

20 Claims, 5 Drawing Sheets

INTERFACE BUILT IN TEST FAILURE DETECTION APPARATUS

BACKGROUND

The present disclosure relates generally to read out integrated circuits, and more particularly, to failure tests for a digital read out integrated circuit.

A readout integrated circuit (ROIC) is an integrated circuit (IC) used for reading certain types of image or light detectors such as, for example, infrared (IR) detectors and ultraviolet (UV) detectors. A ROIC operates by accumulating the photocurrent from each pixel and then transfer the resultant signal onto output taps for readout. Some ROICs may support several input/output (I/O) interfaces that correspond to different types of sensors and/or embedded calibration functions with memory devices. Accordingly, the various I/O interfaces must be tested to confirm proper functionality prior to usage.

SUMMARY

According to a non-limiting embodiment, an interface built-in test (BIT) failure detection circuit includes a sequencing circuit and a multiplexer (MUX). The sequencing circuit is configured to generate a sequence selection signal. The MUX is in signal communication with the sequencing circuit MUX including a plurality of interface inputs, where each interface input corresponds to an interface of a device under test (DUT). The sequence selection signal is configured to control the MUX to sequentially select each of the interface inputs. The MUX includes an output terminal configured to output a test signal configured to indicate whether or not at least one fault corresponding to one or more of the interface inputs or a main power supply exists.

According to another non-limiting embodiment, a method of controlling an interface built-in test (BIT) failure detection circuit is provided. The method comprises generating, by a sequencing circuit, a sequence selection signal, and delivering the sequence selection signal to a multiplexer (MUX) that includes a plurality of interface inputs. Each interface input corresponds to an interface of a device under test (DUT). The method further comprises controlling the MUX to sequentially select each of the interface inputs in response to the sequence selection signal. The method further comprises outputting, from an output terminal of the MUX, a test signal configured indicate whether or not at least one fault corresponding to one or more of the interface inputs or a main power supply exists.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

The proper performance of a ROIC is dependent on the characteristics of the input/output (I/O) supply voltages provided to its various interfaces and I/Os. Therefore, it is desirable to perform a failure detection test to determine a given interface or I/O is receiving the proper supply voltage. Failure detection, however, can be difficult to determine at the system level especially in systems with limited telemetry data for interfaces. Some ROICs may include a built-in test (BIT) test for interface voltages. However, for the various stages of the BIT function to operate correctly, known BIT tests not only require the presence of the main power supply voltage, but also require the interfaces themselves to be functioning correctly, e.g., without all of the power supply interfaces of the DUT receiving their respective supply voltage.

Non-limiting embodiments of the present disclosure provide an interface BIT failure detection circuit, which generates serialized readback of interface voltages from a single supply for failure detection on any supply, including the supply of the interface BIT failure detection circuit. The interface BIT failure detection circuit includes an oscillator and a multiplexer. The oscillator is configured to operate at a rather slow frequency, while also operating to serialize a read back of the various input voltages. The digital control logic for the serialization (i.e., the serialized read back) can be implemented in a number of ways using a counter/decoder or a shift register, for example. The multiplexor is driven by the control logic to echo back or return detections of all supply voltages and corresponding ground references. The bias of the failure BIT performed by the interface BIT failure detection circuit can self-detect since the interface BIT failure detection circuit would not operate if the bias it was on is open. The sequence read out allows for the need of only one main supply voltage to then perform the failure BIT to test the I/O supply voltages of the various interfaces. When no signals (e.g., supply voltages, power on signals, clear signals, etc.) for any of the I/O interfaces are detected, the failure BIT determines that the main supply voltage is faulty.

Figure 1:
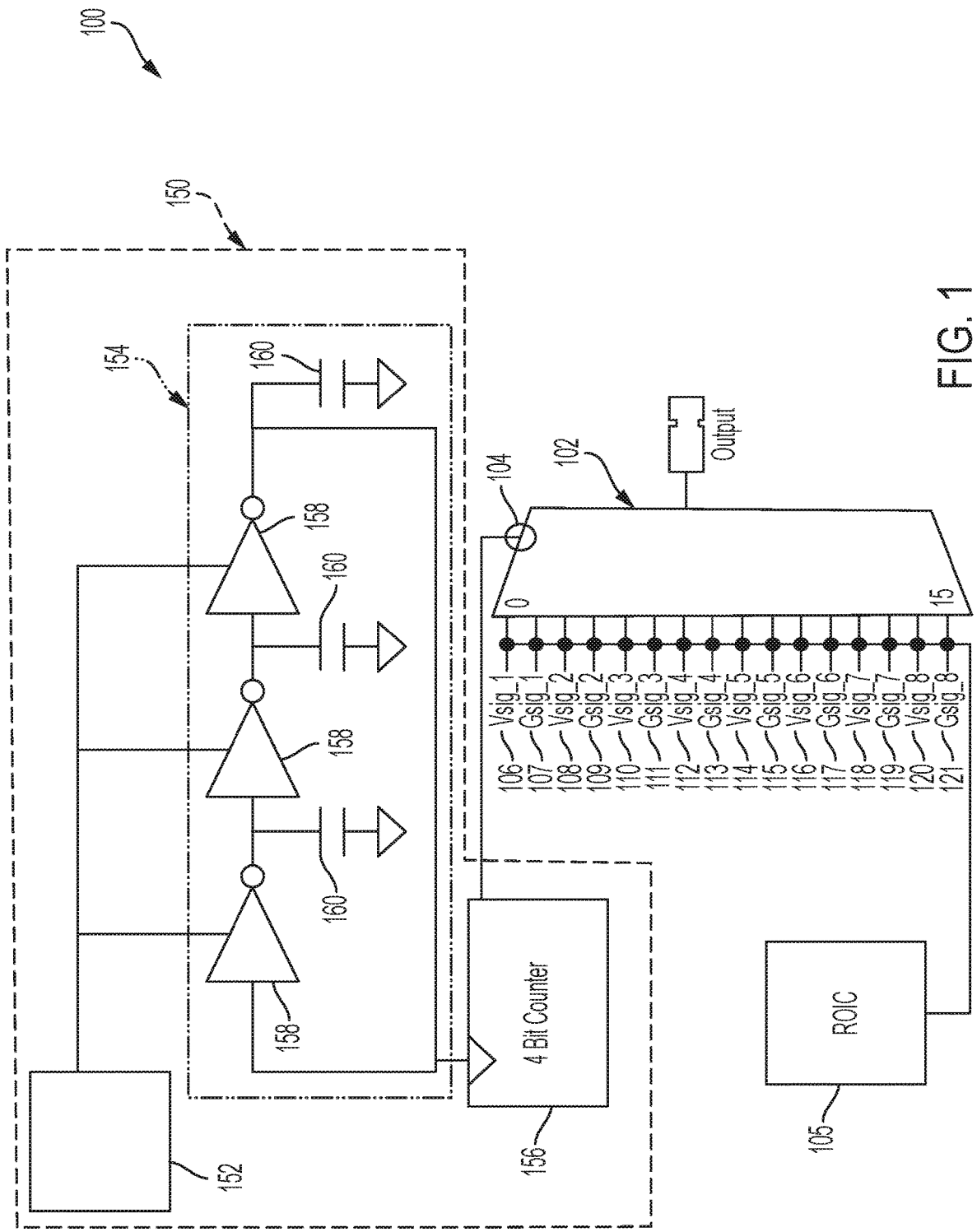
FIG. 1 is a block diagram of an interface built-in test (BIT) failure detection circuit according to a non-limiting embodiment of the present disclosure.

With reference now to FIG. 1, an interface BIT failure detection circuit 100 is illustrated according to a non-limiting embodiment of the present disclosure. The BIT failure detection circuit 100 includes a multiplexer (MUX) 102 and a sequencing circuit 150. The MUX 102 includes a sequencing input 104 and a plurality of interface inputs 106-121. The sequencing input 104 is in signal communication with an output of the sequencing circuit 150 to receive a sequence selection signal, which controls the MUX 102 to sequentially select each of the interface inputs 106-121.

The interface inputs 106-121 are provided by a device under test (DUT) 105 and correspond to the different DUT I/O and/or sensor interfaces. Although the DUT 105 is described herein as a ROIC, it should be appreciated that the interface BIT failure detection circuit 100 can be utilized with other DUTs without departing from the scope of the invention. The interface inputs 106-121 include a plurality of supply voltage inputs 106, 108, 110, 112, 114, 116, 118, 120 (collectively referred to as 106-120) and a plurality of ground inputs 107, 109, 111, 113, 115, 117, 119, 121 (collectively referred to as 107-121).

The sequencing circuit 150 is configured to generate the sequence selection signal. According to a non-limiting embodiment, the speed at which the MUX 102 cycles through the selection of interface inputs 106-121 is controlled by the frequency of the sequence selection signal. In one or more non-limiting embodiments, the sequence selection signal has a frequency of about 300 kilohertz (kHz), which allows the interface BIT failure detection circuit 100 to test a given interface input 106-121 every 3 microseconds (μs).

The sequencing circuit 150 includes a main power supply 152, an oscillator 154, and an n-bit counter 156. The main power supply 152 includes a self-biasing current reference source, for example, and is configured to drive the sequencing circuit 150 to generate the sequence selection signal.

The oscillator 154 can be constructed as a ring oscillator circuit, which includes an odd number of NOT gates 158 (i.e., "inverters") connected in a chain. The output of the last inverter 158 is fed back into the first inverter 158 to form a ring, which allows the oscillator 154 to generate an output signal that oscillates between two voltage levels. In one or more non-limiting embodiments, a capacitor 160 may be connected between the output of each inverter and ground to filter smoothen the output signal.

The n-bit counter 156 is designed according to the number of interface inputs 106-121 included in the MUX 102. The example described herein utilizes a 4-bit counter based on the 16 (0-15) interface inputs 106-121. Accordingly, each bit combination indicated by the sequence selection signal output from the 4-bit counter corresponds to a selectable interface input 106-121 of the MUX 102. For example, a bit combination of "0000" can correspond to supply voltage input 106, a bit combination of "0001" can correspond to ground input 107 . . . and a bit combination of "1111" can correspond to ground input 121. By sequentially counting through the bit combinations of the n-bit counter 156, the MUX can be driven to sequentially select and test each of the interface inputs 106-121 of the DUT 105 without requiring all of the interfaces of the DUT to be functioning correctly.

Figure 2:
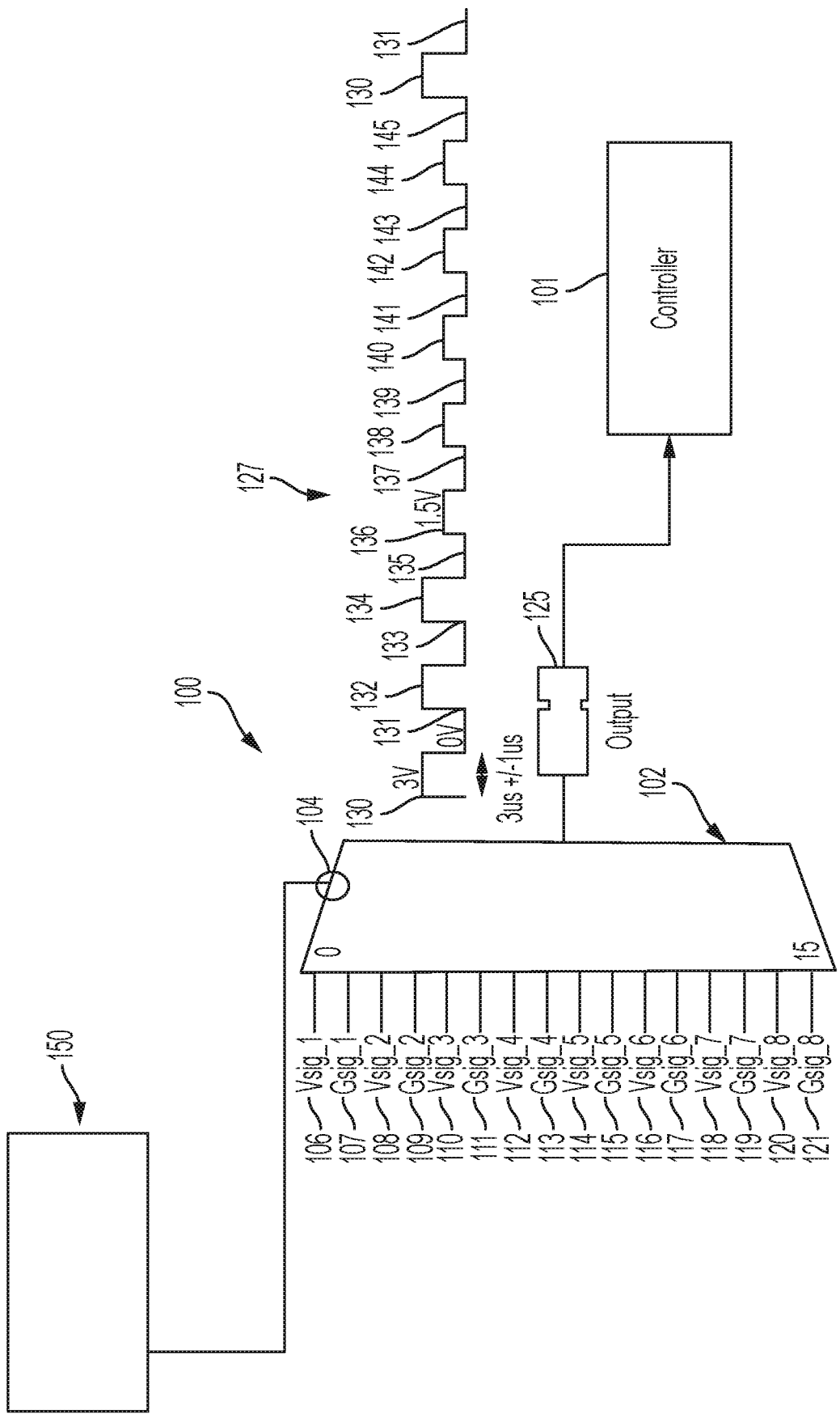
FIG. 2 depicts the output of the interface BIT failure detection circuit when no faults are detected.

Referring to FIG. 2, the MUX 102 further includes an output 125 (e.g., an output terminal 125) configured to output a test signal 127. The test signal 127 is configured to indicate at least one of a supply voltage input fault corresponding to at least one of the supply voltage inputs 106-120, a ground input fault corresponding to at least one of the ground inputs 107-121, and a main supply fault corresponding to the main power supply 152 as described in greater detail below.

According to a non-limiting embodiment of the present disclosure, the test signal 127 includes an alternating sequence of voltage values 130, 131, 132, 133, 134, 135, 136, 137, 138, 139, 140, 141, 142, 143, 144 and 145 (collectively referred to as 130-145). Each of the voltage values (130-145) correspond to one of the supply voltage inputs 106-120 or one of the ground inputs 107-121. For example, voltage value 130 corresponds to supply voltage input 106, voltage value 131 corresponds to ground input 107, voltage value 132 corresponds to supply voltage input 108, voltage value 133 corresponds to ground input 109, etc. In one or more embodiments the voltage values 130-145 can include one or more high voltage values corresponding to the supply voltage inputs 106-120 (e.g., 3.0 V corresponding to voltage value 130 and 1.5 V corresponding to voltage value 136), and a low voltage value corresponding to the ground inputs 107-121 (e.g., 0 V corresponding to voltage value corresponding to voltage value 131).

In the example shown in FIG. 2, the test signal 127 output from the interface BIT failure detection circuit is in a state where no faults are detected since the voltage values 130-145 are at their expected voltage values. The alternating sequence between high voltage values (e.g., 3.0 V and 1.5 V) and low voltage values (e.g., 0 V) can be achieved by alternating the MUX interface inputs 106-121 between the supply voltage interfaces of the MUX 102 and the ground interface interfaces of the MUX. In this manner, the test signal 127 can be conveniently analyzed to confirm the expected voltage value for each MUX interface is appearing at its corresponding interface input 106-121.

In at least one non-limiting embodiment of the present disclosure, the output 125 of the MUX 102 is connected to a controller 101. The controller 101 is configured to process the test signal 127 to determine at least one of the supply voltage input fault, the ground input fault, and the main supply fault based on the test signal 127. In at least one non-limiting embodiment of the present disclosure, the controller 101 is programmed with an expected voltage value for each of the supply voltage inputs 106-120 and the ground inputs 107-121. Accordingly, the controller 101 can determine at least one of the supply voltage input fault, the ground input fault, and the main supply fault in response to determining the voltage value included in the test signal 127 does not match the expected voltage value of the corresponding input 106-121.

Figure 3:
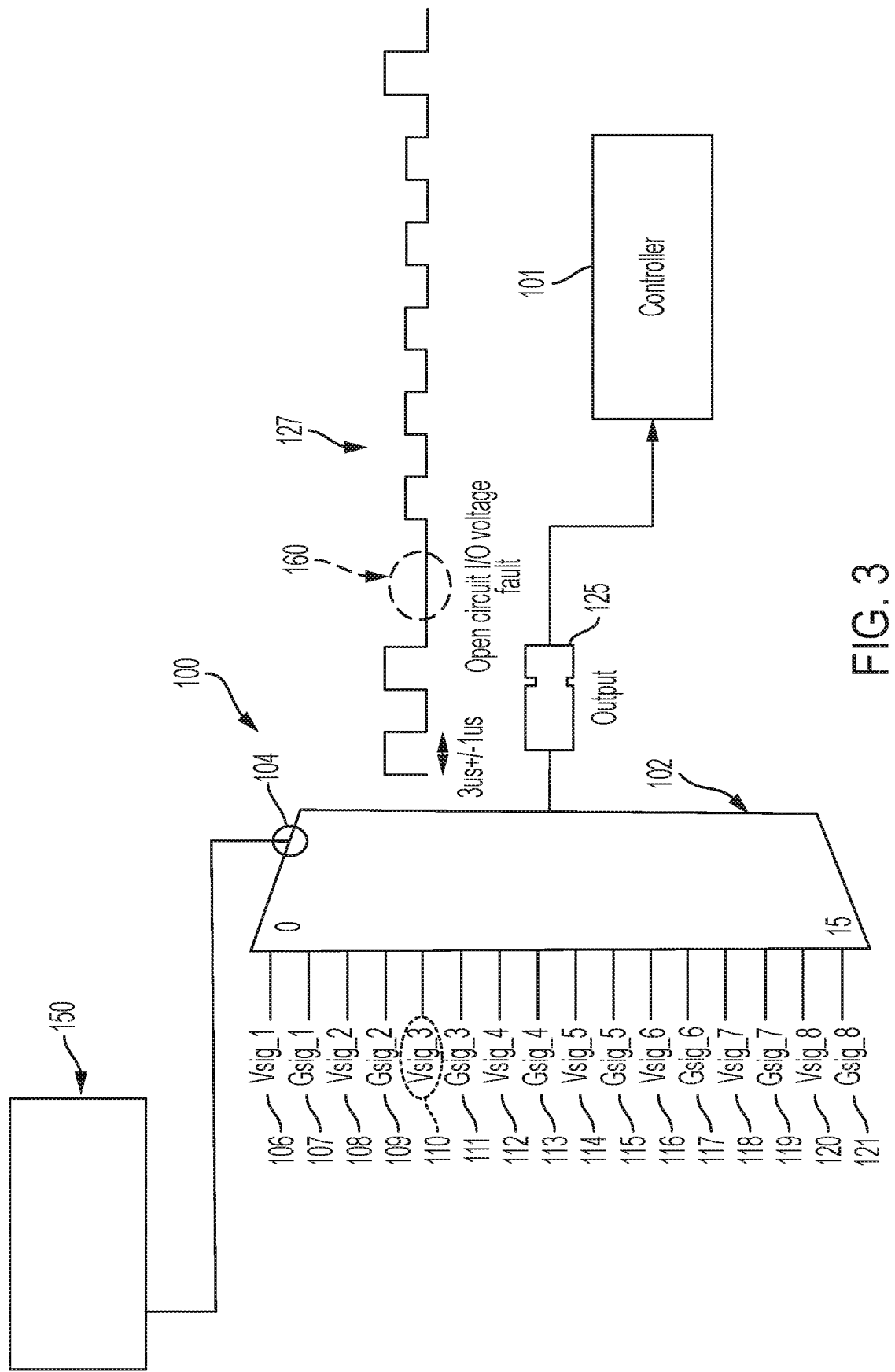
FIG. 3 depicts the output of the interface BIT failure detection circuit when detecting an open circuit fault corresponding to a tested I/O voltage supply interface.

Turning to FIG. 3, the test signal 127 is depicted while including an open circuit fault detection 160 corresponding to voltage supply voltage input 110. Rather than having an expected high voltage value 134 (e.g., 3.0 V shown in FIG. 2), the voltage value indicated by the test signal 127 is a low voltage value (e.g., 0 V). Accordingly, the controller 101 determines that the voltage supply voltage input 110 is experiencing an open circuit fault.

Figure 4:
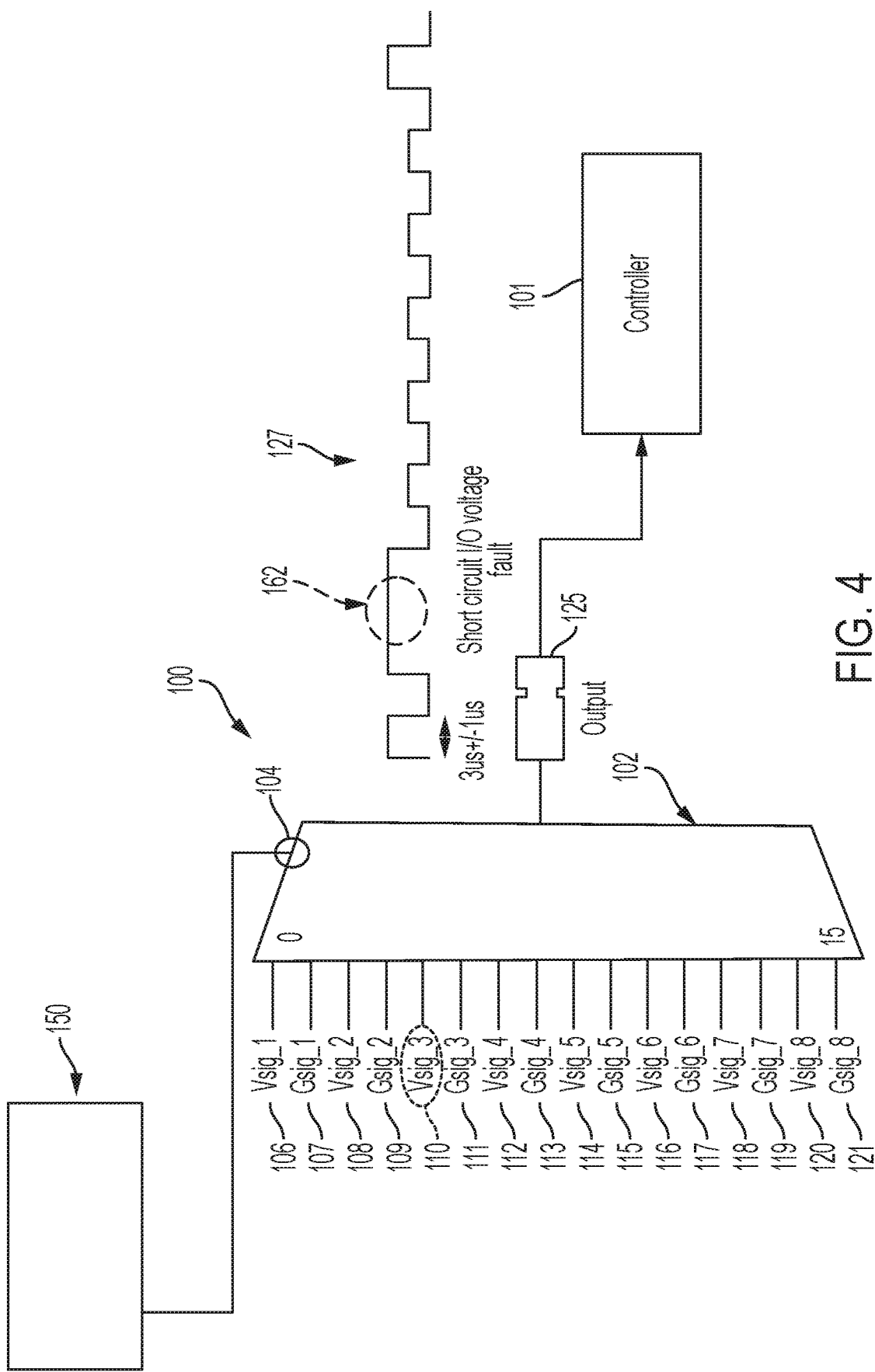
FIG. 4 depicts the output of the interface BIT failure detection circuit when detecting a short circuit fault corresponding to a tested I/O ground interface.

Turning now to FIG. 4, the test signal 127 is depicted while including a short circuit fault detection 162 corresponding to ground input 109. Rather than having an expected low voltage value 133 (e.g., 0 V shown in FIG. 2), the voltage value indicated by the test signal 127 is a high voltage value (e.g., 3.0 volts (V)). Accordingly, the controller 101 determines that the ground input 109 is experiencing a short circuit fault.

Figure 5:
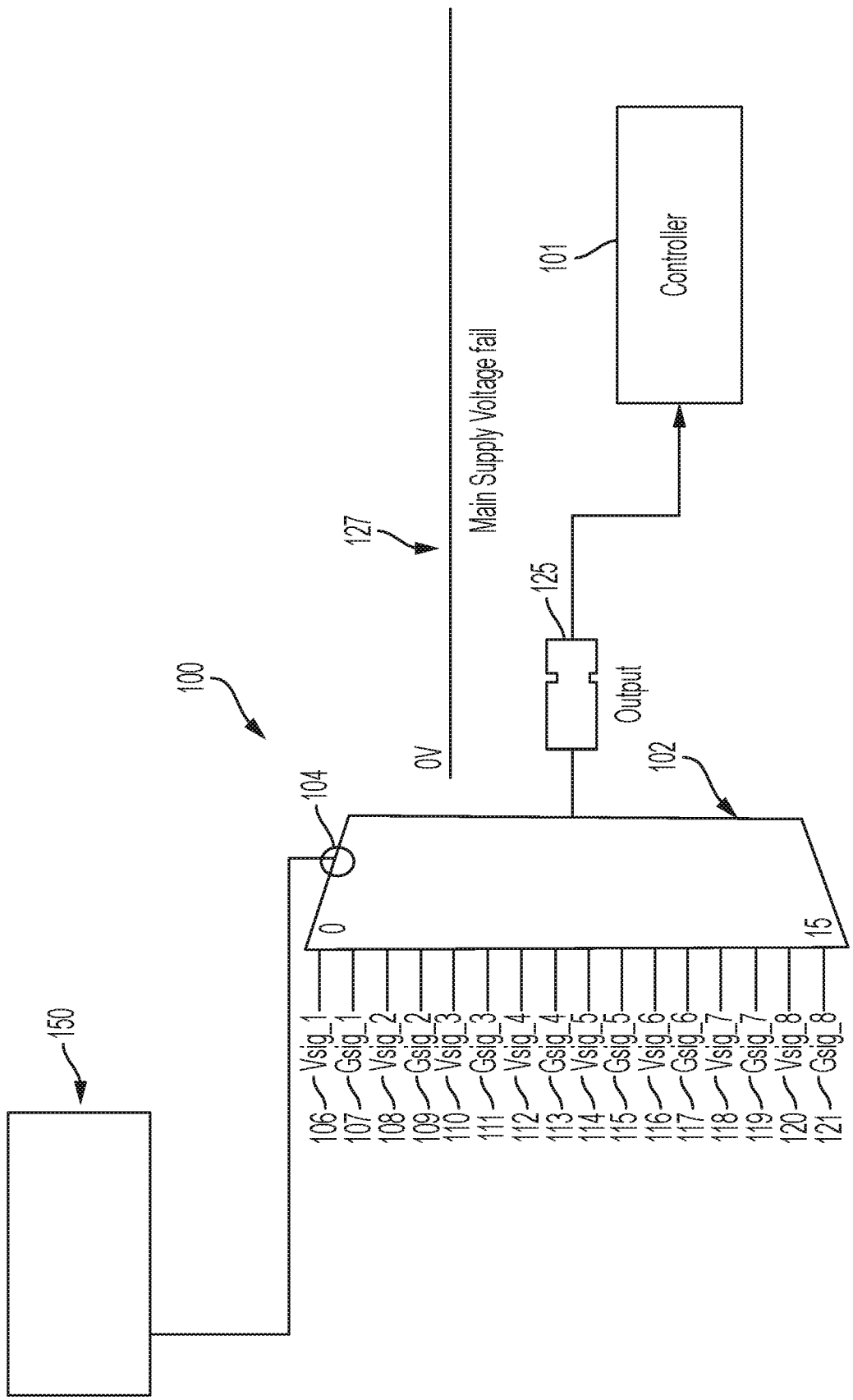
FIG. 5 depicts the output of the interface BIT failure detection circuit when detecting a main supply voltage fault.

Referring now to FIG. 5, the test signal 127 is depicted while the sequencing circuit 150 is experiencing a fault. For example, the main power supply 152 may experience an open circuit fault, halting power supply to the sequencing circuit. As a result, the test signal 127 output from the MUX 102 has a constant low voltage value (e.g., 0 V) Accordingly, the controller 101 can identify the constant low voltage value 127 of the test signal 127 rather than the expected alternating sequence of voltage values 130-145, and identify that the sequencing circuit 150 and/or the main power supply 152 is experiencing a fault.

While a number of test examples have been discussed above, mostly focusing on a single interface test for the ease of explanation, it should be appreciated that the techniques and devices disclosed herein are suitable for fault testing any number of interface inputs, power signals, sensor outputs or a combination thereof. Based on the number and type of input signals at the interface inputs, a known output signal pattern can be expected at the output which can indicate whether or not a fault has occurred at one of the input interfaces, the power supply or both.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the present disclosure.

What is claimed is:

1. An interface built-in test (BIT) failure detection circuit comprising:
   a sequencing circuit configured to generate a sequence selection signal,
   a multiplexer (MUX) in signal communication with the sequencing circuit, the MUX including a plurality of interface inputs, each interface input corresponding to an interface of a device under test (DUT),
   wherein the sequence selection signal is configured to control the MUX to sequentially select each of the interface inputs, and
   wherein the MUX includes an output terminal configured to output a test signal configured to indicate whether or not at least one fault corresponding to one or more of the interface inputs or a main power supply exists.

2. The interface BIT failure detection circuit of claim 1, wherein the interface inputs include a plurality of supply voltage inputs and a plurality of ground inputs.

3. The interface BIT failure detection circuit of claim 1, wherein the test signal further indicates the at least one fault corresponding to the one or more of the interface inputs or the main power supply, and wherein the at least one fault includes a supply voltage input fault corresponding to at least one of the supply voltage inputs, a ground input fault corresponding to at least one of the ground inputs, or a main supply fault corresponding to the main power supply.

4. The interface BIT failure detection circuit of claim 3, wherein a speed at which the MUX cycles through the selection of interface inputs is controlled by a frequency of the sequence selection signal.

5. The interface BIT failure detection circuit of claim 4, wherein the sequence selection signal has a frequency of about 300 kilohertz (kHz).

6. The interface BIT failure detection circuit of claim 4, wherein the interface inputs include a plurality of supply voltage inputs and a plurality of ground inputs.

7. The interface BIT failure detection circuit of claim 6, wherein the test signal includes an alternating sequence of voltage values, each of the voltage values corresponding to one of the supply voltage inputs or one of the ground inputs.

8. The interface BIT failure detection circuit of claim 7, wherein the output terminal is in signal communication with a controller, and
   wherein the controller processes the test signal and determines at least one of the supply voltage input fault, the ground input fault, and the main supply fault based on the test signal.

9. The interface BIT failure detection circuit of claim 8, wherein the controller is programmed with an expected voltage value for each of the supply voltage inputs and each of the ground inputs, and determines at least one of the supply voltage input fault, the ground input fault, and the main supply fault in response to determining the voltage value of one or more of the supply voltage input and the ground input included in the test signal does not match the expected voltage value.

10. The interface BIT failure detection circuit of claim 9, wherein the controller determines a given supply voltage input among the plurality of supply voltage inputs is experiencing an open circuit fault in response to determining its corresponding voltage value is the low voltage value.

11. The interface BIT failure detection circuit of claim 9, wherein the controller determines a given ground input among the plurality of ground inputs is experiencing a short circuit fault in response to determining its corresponding voltage is the high-voltage value.

12. The interface BIT failure detection circuit of claim 9, wherein the controller determines the sequencing circuit is experiencing a fault in response to the test signal remaining at the low voltage or the high value.

13. The interface BIT failure detection circuit of claim 1, wherein the sequencing circuit comprises:
    a main power supply;
    an oscillator; and
    an n-bit counter.

14. The interface BIT failure detection circuit of claim 13, wherein the oscillator is a ring oscillator.

15. The interface BIT failure detection circuit of claim 14, wherein the ring oscillator comprises an odd number inverters connected in a chain, and wherein an output of a last inverter included the chain is fed back into a first inverter included in the chain to form a ring.

16. The interface BIT failure detection circuit of claim 13, wherein the interface inputs alternate between a voltage supply input among the plurality of voltage supply inputs and a ground input among the plurality of ground inputs.

17. A method of controlling an interface built-in test (BIT) failure detection circuit comprising:
    generating, by a sequencing circuit, a sequence selection signal;
    delivering the sequence selection signal to a multiplexer (MUX) that includes a plurality of interface inputs, each interface input corresponding to an interface of a device under test (DUT);
    controlling the MUX to sequentially select each of the interface inputs in response to the sequence selection signal; and
    outputting, from an output terminal of the MUX, a test signal indicating whether at least one fault corresponding to one or more of the interface inputs or a main power supply exists.

18. The method of claim 17, wherein:
    the interface inputs include a plurality of supply voltage inputs and a plurality of ground inputs,
    the test signal further indicates the at least one fault corresponding to the one or more of the interface inputs or the main power supply, and the at least one fault includes a supply voltage input fault corresponding to at least one of the supply voltage inputs, a ground input fault corresponding to at least one of the ground inputs, or a main supply fault corresponding to the main power supply.

19. The method of claim 18, further comprising setting a frequency of the sequence selection signal to control a speed at which the MUX cycles through the selection of interface inputs.

20. The method of claim 19, wherein outputting the test signal further comprises generating an alternating sequence of voltage values, each of the voltage values corresponding at least one supply voltage input included in the plurality of supply voltage inputs and at least ground input included in the plurality of ground inputs.

* * * * *